United States Patent
Feng et al.

(10) Patent No.: US 7,392,464 B1
(45) Date of Patent: Jun. 24, 2008

(54) UNIVERSAL PARITY ENCODER

(75) Inventors: Weishi Feng, San Jose, CA (US); Zhan Yu, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 468 days.

(21) Appl. No.: 10/896,726

(22) Filed: Jul. 22, 2004

Related U.S. Application Data

(60) Provisional application No. 60/566,979, filed on Apr. 30, 2004.

(51) Int. Cl.
*G06F 11/00* (2006.01)
*H03M 13/00* (2006.01)

(52) U.S. Cl. ............................. 714/809; 714/701
(58) Field of Classification Search ............... 714/755, 714/809
See application file for complete search history.

(56) References Cited

U.S. PATENT DOCUMENTS

| | | | |
|---|---|---|---|
| 6,317,856 B1 * | 11/2001 | Fredrickson et al. | 714/755 |
| 6,456,208 B1 * | 9/2002 | Nazari et al. | 341/59 |
| 6,631,490 B2 * | 10/2003 | Shimoda | 714/755 |
| 6,795,947 B1 * | 9/2004 | Siegel et al. | 714/802 |

OTHER PUBLICATIONS

U.S. Appl. No. 10/715,551, filed Nov. 17, 2003, Feng, Weishi.
U.S. Appl. No. 10/714,804, filed Nov. 17, 2003, Feng, Weishi.
U.S. Appl. No. 10/639,796, filed Aug. 12, 2003, Feng, Weishi et al.
U.S. Appl. No. 10/423,552, filed Apr. 25, 2003, Feng, Weishi et al.

* cited by examiner

*Primary Examiner*—Shelly Chase

(57) ABSTRACT

A data encoding system for a data stream comprises an interleaving module that receives the data stream as N bit data blocks and that reverses positions of at least two of the N bits of selected ones of the data blocks. A generating module generates P error checking bits for each of the N bit data blocks. An insertion module receives the P error checking bits from the generating module and inserts the P error checking bits into the corresponding data block received from the interleaving module.

32 Claims, 8 Drawing Sheets

UNIVERSAL PARITY ENCODER

CROSS-REFERENCE TO RELATED APPLICATIONS

This application claims the benefit of U.S. Provisional Application No. 60/566,979, filed on Apr. 30, 2004. The disclosure of the above application is incorporated herein by reference.

FIELD OF THE INVENTION

The present invention relates to data coding in communications channels, and more particularly to data coding that incorporates error checking or correcting information without destroying G/I constraints.

BACKGROUND OF THE INVENTION

Many communication systems, including magnetic and optical recording systems, are constrained as to the types of binary data patterns that can be communicated. One limitation relates to the maximum number of consecutive zeros that can be present in a binary data sequence, and is commonly referred to as the G constraint. Another limitation relates to the maximum number of zeros in alternating bit positions that can be present in a data sequence and is commonly referred to as the I constraint. For instance, in a bit sequence $b_0 b_1 b_2 b_3 b_4 b_5 b_6 b_7$, the I constraint determines the maximum number of consecutive zeros allowed in the strings of even-numbered bits and odd-numbered bits ($b_0 b_2 b_4 b_6$ and $b_1 b_3 b_5 b_7$). G and I constraints are often written in slash notation as a G/I constraint, such as 20/18, where 20 is the G constraint and 18 is the I constraint. Many communications channels have a G/I constraint to control DC level, allow reliable clock recovery, and/or permit receiver synchronization.

It is often valuable to use parity encoding on data with G/I constraints. Referring now to FIG. 1A, an exemplary communications channel 10 is shown that receives input data 12 satisfying a G/I constraint. A parity encoder 14 calculates P parity bit(s) and combines the P parity bit(s) with the incoming data 12. An encoded data signal 16 from the parity encoder 14 will have a G constraint that is P greater than that of the incoming data 12. There is no guarantee that the encoded data 16 will retain the I constraint (unless P is even). In fact, it is possible for the I constraint of the encoded data 16 to approach infinity. Referring now to FIG. 1B, parity encoded data 18 is decoded by a parity decoder 20. Violation of the original G/I constraint by the communications channel 10 would degrade the system performance. In other words, more system errors would occur.

To solve this problem, prior approaches have required that the RLL code be designed together with the parity code. This close coupling is such that a change to one necessitates a change to the other. For instance, design parameters such as block size often have had to be identical for the G/I and parity systems. This limits the flexibility of communications systems design and increases the difficulty in implementing advantageous changes to either system.

SUMMARY OF THE INVENTION

A data encoding system for a data stream comprises an interleaving, module that receives the data stream as N bit data blocks and that reverses positions of at least two of the N bits of selected ones of the data blocks. A generating module generates P error checking bits for each of the N bit data blocks, wherein P is greater than or equal to one. An insertion module receives the P error checking bits from the generating module and inserts the P error checking bits into the corresponding data block received from the interleaving module.

In other features, the P error checking bits include parity information. P is equal to one. The interleaving module reverses bit positions within one of even data blocks or odd data blocks. The interleaving module swaps the bit positions within each pair of adjacent bits for said selected ones of the data blocks. The data stream has a G/I constraint and the data encoding system produces an output data stream having an output G constraint equal to (G+P) and an output I constraint equal to a rounded up integer of (I+P/2).

A communications system comprises the data encoding system and further comprises a run-length limited (RLL) encoder that generates the data stream.

A communications channel comprises the data encoding system and further comprises a data dependent scrambler (DDS) encoder that generates the data stream.

A read/write channel comprises the data encoding system. An RLL encoder generates the data stream. The data stream has a G/I constraint. The data encoding system produces an output data stream having an output G constraint equal to (G+P) and an output I constraint equal to a rounded up integer of (I+P/2). A DDS encoder generates the data stream. The data stream has a G/I constraint. The data encoding system produces an output data stream having an output G constraint equal to (G+P) and an output I constraint equal to a rounded up integer of (I+P/2).

A data decoding system for an encoded data stream comprises an interleaving module that receives the data stream as N bit data blocks and P bit error checking blocks, that reverses positions of at least two of the N bits of selected ones of the data blocks, and that outputs a data stream. A checking module receives an N bit data block and corresponding P error checking bits from the data stream and checks agreement between the data block and the error checking bits.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1A:
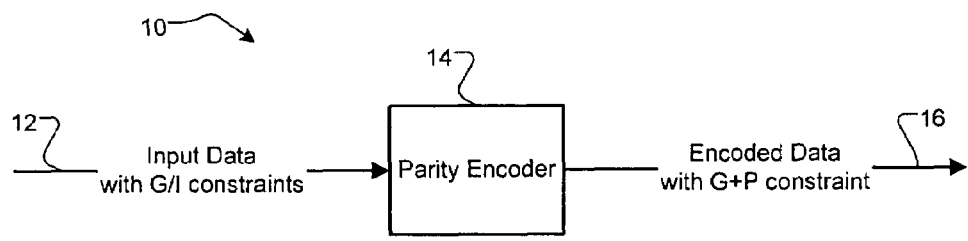
FIGS. 1A and 1B are functional block diagrams illustrating communications channels including an exemplary parity encoder and decoder, respectively, according to the prior art.
Figure 1B:
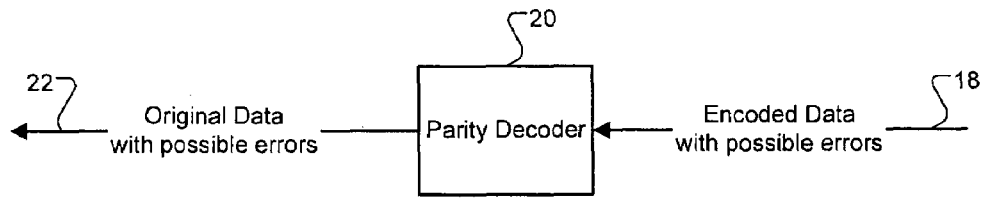

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 2A:
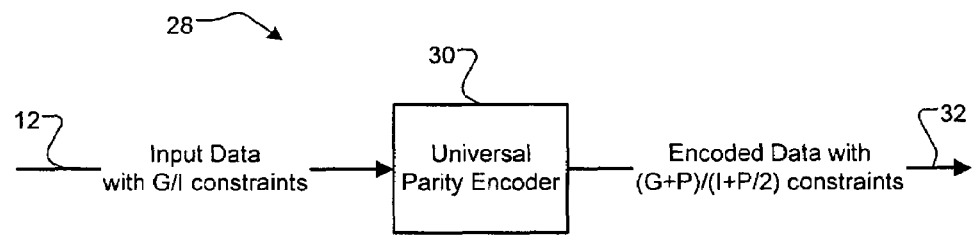
FIGS. 2A and 2B are functional block diagrams illustrating communications channels including an exemplary parity encoder and decoder, respectively, according to the present invention.

The present invention decouples the design of a system imposing G/I constraints from the design of a parity encoding system. Referring now to FIG. 2A, a universal parity encoder system 28 receives input data 12 with certain G/I constraints. The input data 12 is processed by a universal parity encoder 30 that generates P parity bits for each block of N data bits. In some embodiments, N is greater than G. Encoded output data 32 produced by the universal parity encoder has a constraint of $(G+P)/(1+P/2)$. In other words, the maximum number of consecutive zeroes is increased by the number of parity bits P. The maximum number of consecutive zeroes in alternating positions is increased by the number of parity bits P divided by two and rounded up to the nearest whole number.

For example, consider a 16-bit sample data pattern:

| 1 | 0 | 1 | 0 | 0 | 1 | 0 | 1 | 1 | 0 | 1 | 0 | 0 | 1 | 0 | 0 |
|---|---|---|---|---|---|---|---|---|---|---|---|---|---|---|---|
| $b_0$ | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $b_{15}$ |

The greatest number of consecutive zeroes in this pattern is two (e.g., $b_3 b_4$). Because the G constraint determines the maximum consecutive number of zeroes in a bit pattern, the G constraint of whatever produced this bit pattern is at least two. The number of consecutive zeroes in alternating positions (the I constraint) can be more easily visualized when the two interleaved bit patterns are presented individually:

| 1 | 1 | 0 | 0 | 1 | 1 | 0 | 0 |
|---|---|---|---|---|---|---|---|
| $b_0$ | $b_2$ | $b_4$ | $b_6$ | $b_8$ | $b_{10}$ | $b_{12}$ | $b_{14}$ |
| 0 | 0 | 1 | 1 | 0 | 0 | 1 | 0 |
| $b_1$ | $b_3$ | $b_5$ | $b_7$ | $b_9$ | $b_{11}$ | $b_{13}$ | $b_{15}$ |

There are multiple instances of two consecutive zeroes in the interleaved patterns (e.g., $b_4 b_6$ and $b_9 b_{11}$). The I constraint of this data is also at least two. For the purposes of illustration, the source of this bit pattern will be assumed to provide a data stream with a G/I constraint of 2/2. The parity encoder 14 of FIG. 1A and the universal parity encoder 30 will be employed in this example, each of which will generate one parity bit (P=1) for every block of four data bits (N=4) in this illustration. The values of the generated parity bits will vary depending upon the parity algorithm. For the purposes of illustration, a four-input XOR logic function will be used to generate each parity bit.

A parity encoder 14 according to the prior art will insert bits $p_0$ through $p_3$, creating the following output pattern:

| 1 | 0 | 1 | 0 | 0 | 0 | 1 | 0 | 1 | 0 | 1 | 0 | 1 | 0 | 0 | 0 | 1 | 0 | 0 | 1 |
|---|---|---|---|---|---|---|---|---|---|---|---|---|---|---|---|---|---|---|---|
| $b_0$ | $b_1$ | $b_2$ | $b_3$ | $p_0$ | $b_4$ | $b_5$ | $b_6$ | $b_7$ | $p_1$ | $b_8$ | $b_9$ | $b_{10}$ | $b_{11}$ | $p_2$ | $b_{12}$ | $b_{13}$ | $b_{14}$ | $b_{15}$ | $p_3$ |

In this example, there are three consecutive zeroes at $b_3 p_0 b_4$, violating the input data's G constraint of two. This conforms with the predicted output G constraint $G+P (2+1=3)$. To determine the effect of the parity encoder 14 on the I constraint, the alternating bit sequences are presented as follows:

| 1 | 1 | 0 | 1 | 1 | 1 | 1 | 0 | 1 | 0 |
|---|---|---|---|---|---|---|---|---|---|
| $b_0$ | $b_2$ | $p_0$ | $b_5$ | $b_7$ | $b_8$ | $b_{10}$ | $p_2$ | $b_{13}$ | $b_{15}$ |
| 0 | 0 | 0 | 0 | 0 | 0 | 0 | 0 | 0 | 1 |
| $b_1$ | $b_3$ | $b_4$ | $b_6$ | $p_1$ | $b_9$ | $b_{11}$ | $b_{12}$ | $b_{14}$ | $p_3$ |

The I constraint has been destroyed, with nine consecutive zeroes in alternating positions. The first bits ($b_0$ through $b_7$) of the input pattern could be replicated to make the alternating zeroes repeat indefinitely. This presents obvious problems for communication systems with G/I constraints.

The universal parity encoder 30 generates the same parity bits and inserts them in the same positions as does the parity encoder 14 contemplated by the prior art. The difference is that the universal parity encoder 30 switches alternate bits in every other block of N bits, starting with the second block. In other words, the order of bits in the second block will be rearranged, as will those in the fourth block, and the sixth, etc. The rearrangement proceeds as follows: the first bit is swapped with the second, the third bit is swapped with the fourth, etc. If there are an odd number of bits, the last bit remains unchanged. This scheme will produce the following, when presented with the sample data pattern above:

| 1 | 0 | 1 | 0 | 0 | 1 | 0 | 1 | 0 | 0 | 1 | 0 | 1 | 0 | 0 | 1 | 0 | 0 | 0 | 1 |
|---|---|---|---|---|---|---|---|---|---|---|---|---|---|---|---|---|---|---|---|
| $b_0$ | $b_1$ | $b_2$ | $b_3$ | $p_0$ | $b_5$ | $b_4$ | $b_7$ | $b_6$ | $p_1$ | $b_8$ | $b_9$ | $b_{10}$ | $b_{11}$ | $p_2$ | $b_{13}$ | $b_{12}$ | $b_{15}$ | $b_{14}$ | $p_3$ |

The positions of alternate bits in the second and fourth blocks are reversed (bits $b_4$ through $b_7$ and $b_{12}$ through $b_{15}$). Note that the order of the first and third blocks of N bits are not altered. The G constraint has been increased by at least one, as evidenced by the three consecutive zeroes at bits $b_{12}b_{15}b_{14}$. This matches the expected value of three from the expression G+P (2+1=3). Once again, the I constraint can best be visualized by separating the two interleaved sequences.

| 1 | 1 | 0 | 0 | 0 | 1 | 1 | 0 | 0 | 0 |
|---|---|---|---|---|---|---|---|---|---|
| $b_0$ | $b_2$ | $p_0$ | $b_4$ | $b_6$ | $b_8$ | $b_{10}$ | $p_2$ | $b_{12}$ | $b_{14}$ |
| 0 | 0 | 1 | 1 | 0 | 0 | 0 | 1 | 0 | 1 |
| $b_1$ | $b_3$ | $b_5$ | $b_7$ | $p_1$ | $b_9$ | $b_{11}$ | $b_{13}$ | $b_{15}$ | $p_3$ |

The I constraint has likewise been increased from two to three (e.g., $p_0b_4b_6$), as predicted by i+P/2 (2+½=2.5, which must then be rounded up to 3). This represents an improvement over the possibly unlimited string of zeroes generated by the parity encoder 14 contemplated by the prior art. The reason this technique is effective can be seen when looking at the subscript numbers of the interleaved sequences above. The original even-numbered bits and odd-numbered bits have remained separated between the two interleaved sequences. The parity encoder 14 contemplated by the prior art does not preserve this relationship, with even-numbered and odd-numbered bits being interspersed in the interleaved sequences.

Figure 2B:
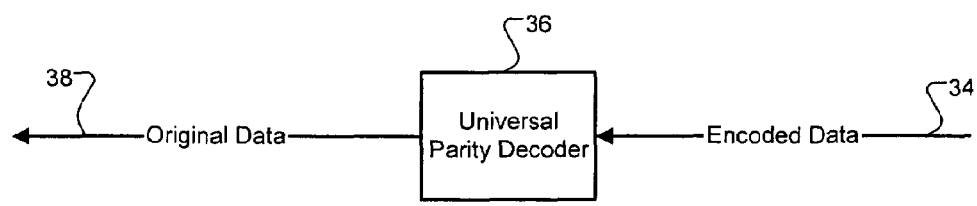

Referring now to FIG. 2B, encoded data 34 is decoded by a universal parity encoder 36, resulting in output data 38 that will be equal to the original data 12, if there were no errors in the encoded data 34 created by intervening processing.

Figure 3A:
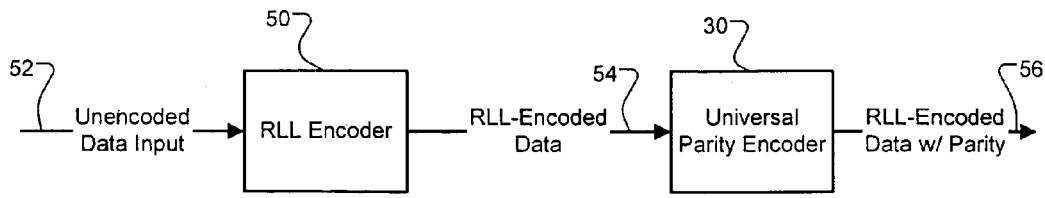
FIGS. 3A and 3B are functional block diagrams illustrating communications channels including an exemplary parity encoder and decoder, respectively, according to the present invention, in conjunction with a run-length limited (RLL) encoder and decoder, respectively.
Figure 3B:
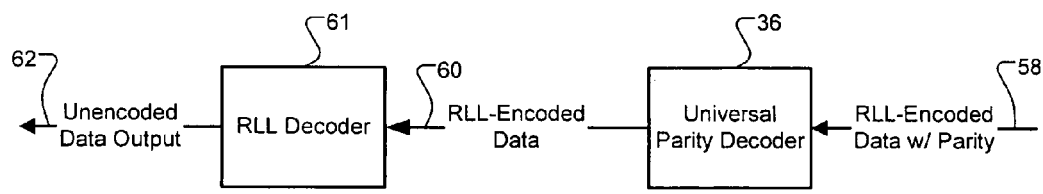

Referring now to FIGS. 3A and 3B, a run-length limited (RLL) encoder 50 takes as input unencoded data 52, and outputs RLL-encoded data 54 which has a G/I constraint. The RLL-encoded data 54 is then processed by the universal parity encoder 30, producing RLL-encoded data containing parity information 56 and having a constraint of (G+P)/(1+P/2). To recover the original unencoded data 52, the universal parity decoder 36 takes RLL-encoded data with additional parity information 58 as input. The universal parity encoder 36 decodes and removes parity information and transmits RLL-ehcoded data 60 to an RLL decoder 61. The RLL decoder 61 then outputs unencoded data 62 that will be equal to the original unencoded data 52, if there were no errors in the encoded data 58 created by intervening processing.

Figure 4A:
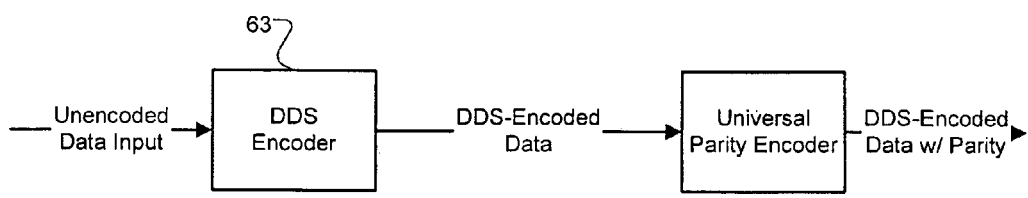
FIGS. 4A and 4B are functional block diagrams illustrating communications channels including an exemplary parity encoder and decoder, respectively, according to the present invention, in conjunction with a data dependent scrambler (DDS) encoder and decoder, respectively.
Figure 4B:
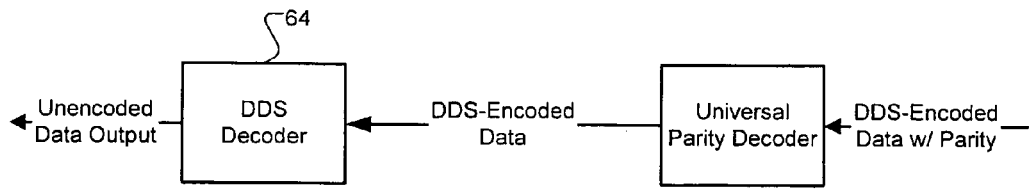

Similarly, FIGS. 4A and 4B show the utility of using the present invention with a data dependent scrambler (DDS) system. Further information concerning data dependent scramblers can be found in "Improved Data Coding For Enforcing Constraints on Ones and Zeros in a Communications Channel," Ser. No. 10/423,552, filed Apr. 25, 2003, "Improving The Hamming Weight Of A Sequence Scrambled By A Data Dependent Scrambler," Ser. No. 10/639,796, filed Aug. 12, 2003, "Further Improved Data Dependant Scrambler," Ser. No. 10/715,551, filed Nov. 17, 2003, and "A Data-Dependent. Scrambler With Global Constraint Only," Ser. No. 10/714,804, filed Nov. 17, 2003, which are hereby incorporated by reference in their entirety.

A DDS system analyzes a data stream containing k number of m-bit symbols, where k is typically less than $(2^m-1)$. The DDS chooses an m-bit symbol that is not equal to any of the k symbols contained in the data stream. Alternatively, the DDS can choose an m-bit symbol that is not equal to any symbol contained in the data stream and not equal to the inverse of any symbol contained in the data stream. The chosen m-bit symbol is then XOR'd with each symbol from the data stream. A DDS system removes unwanted bit patterns from user data without using run length limited coding. The operation of the systems in FIGS. 4A and 4B is similar to that of FIGS. 3A and 3B, with the RLL encoder 50 and the RLL decoder 61 being replaced with a DDS encoder 63 and DDS decoder 64, respectively.

Figure 5A:
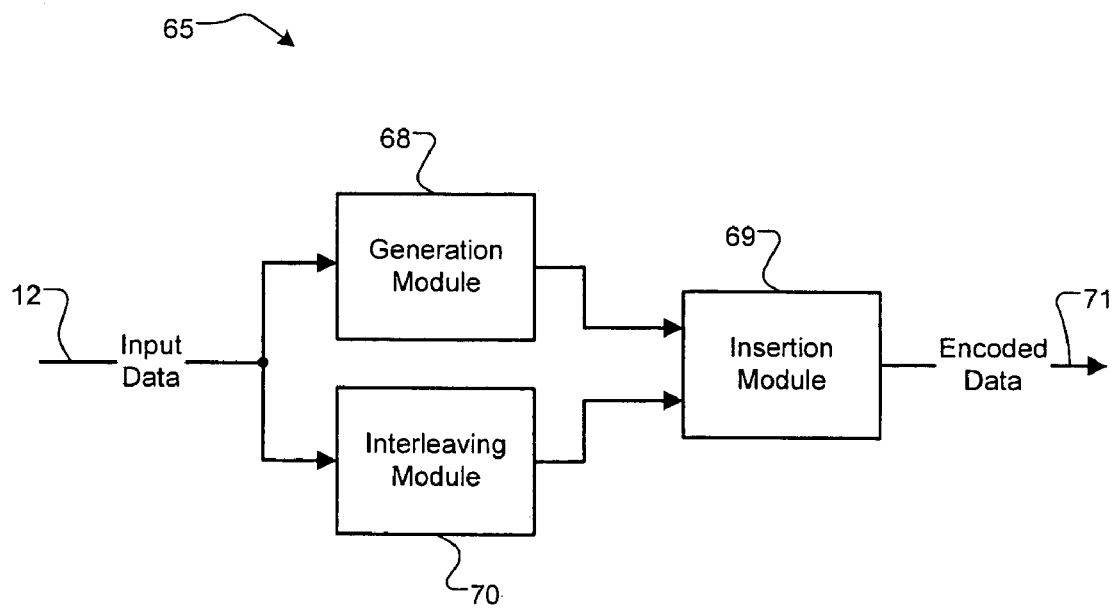
FIG. 5A is a more detailed functional block diagram of an exemplary parity encoder according to the present invention.

Referring now to FIG. 5A, an exemplary universal parity encoding system 65 is depicted. A generation module 68 receives an input data stream 12, which can be interpreted as containing N-bit data blocks. The generation module 68 generates P bits of parity information from each received data block, and communicates this parity information to an insertion module 69. An interleaving module 70 also receives the data stream 12 as N-bit data blocks. The interleaving module 70 switches adjacent bits in every other data block it receives. The interleaving module 70 communicates the data block, whether interleaved or not, to the insertion module 69. The insertion module 69 inserts the parity information from the generation module 68 into the data block received from the interleaving module 70. The resulting encoded data 71 contains P bits of parity information for each block of N data bits, and has new G/I constraints of (G+P)/(1+P/2).

Figure 5B:
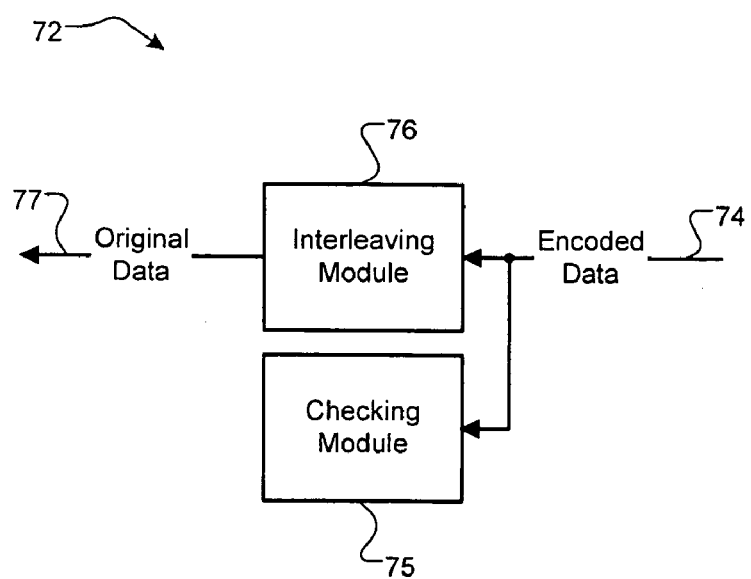
FIG. 5B is a more detailed functional block diagram of an exemplary parity decoder according to the present invention.

Referring now to FIG. 5B, an exemplary universal parity decoding system 72 is depicted. An encoded data stream 74 includes blocks containing N bits of data and P bits of parity information. The N data bits and P parity bits are communicated to a checking module 75 that performs a parity check between the data and parity information. Optionally, action can be taken if the parity check fails. The N data bits of the encoded data stream 74 are also communicated as a data block to an interleaving module 76. The interleaving module 76 switches alternate bits in every other data block that it receives. The interleaving module 76 outputs resulting data 77, which will be a copy of the original data 67, if there were no errors in the encoded data 74 created by intervening processing.

Figure 6A:
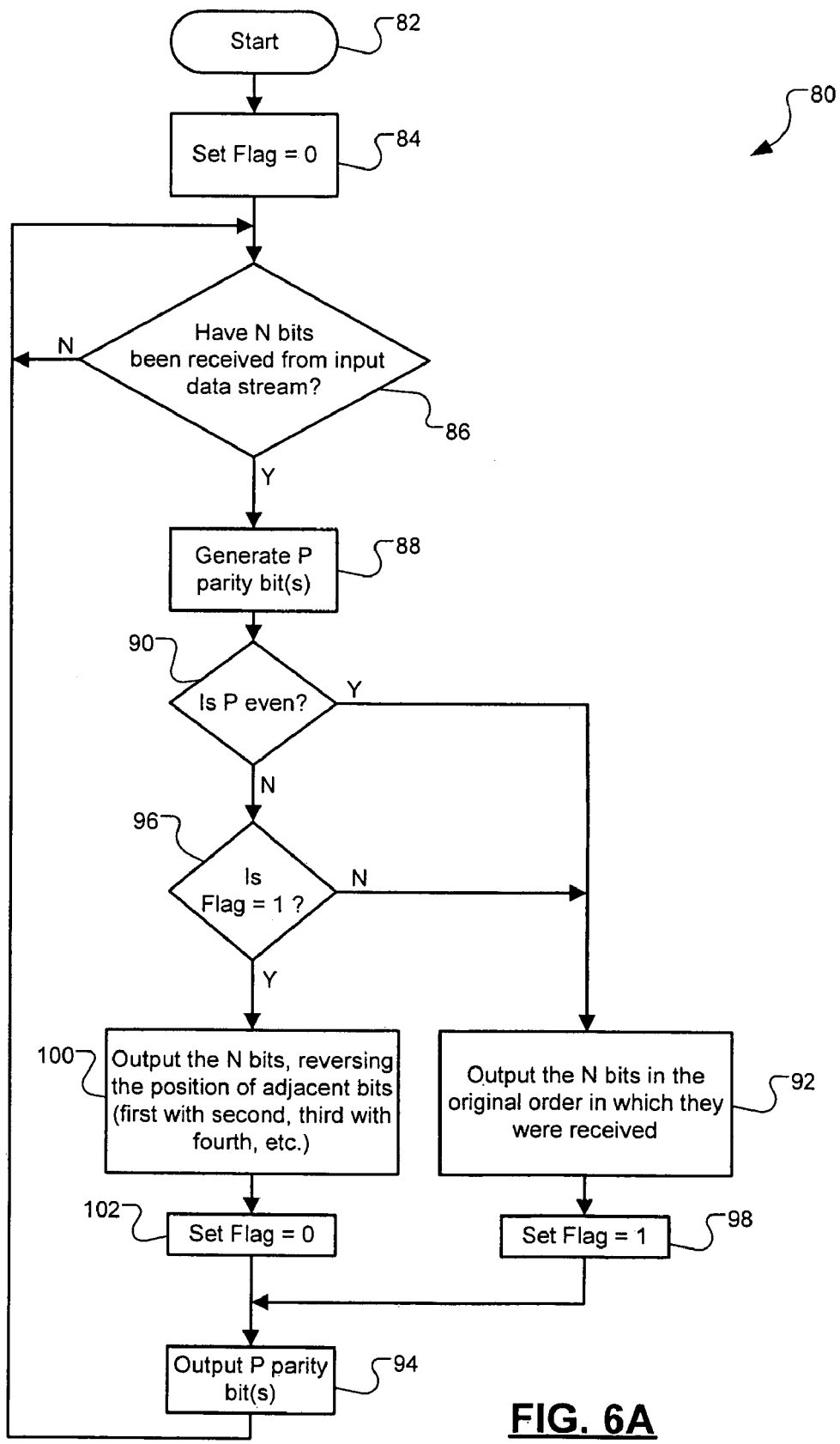
FIG. 6A is a flowchart illustrating steps performed by an exemplary parity encoder according to the present invention.

Referring now to FIG. 6A, an exemplary universal parity encoding system 80 generates P parity bit(s) for every N data bits. After starting in step 82, a flag is initialized to zero in step 84. The system then waits for a block of N data bits to be received in step 86. The system generates P parity bit(s) in step 88. If P is even in step 90, no special processing is necessary and the N data bits are output in step 92 in the order in which they were received. The P parity bit(s) that were generated are then appended to the output in step 94. This is repeated for every block of N data bits received.

If the number P is odd in step 90, however, the internal order of alternating blocks of N data bits will be changed. On the first pass, the flag condition in step 96 will test false, and the N data bits will be output in the order in which they were received in step 92. The flag is then set to one in step 98. Once the next block of N data bits is received in step 86, the flag now being one in step 96, the N data bits will be interchanged before being output in step 100. They are interchanged by swapping each bit with the one adjacent to it. For example, if N equals four (a four-bit sequence), the first bit will be swapped with the second, and the third bit will be swapped with the fourth. As an example of odd N, when N equals five, the first bit will be swapped with the second, the third bit will be swapped with the fourth, and the fifth bit will remain in its original position. The flag is re-set to zero in step 102, the P parity bit(s) are output in step 94, and the system will await the arrival of N more data bits in step 86. This pattern will repeat, with N bits being output in their original order in step 92, followed by the next N bits being output with adjacent bits reversed in step 100.

Figure 6B:
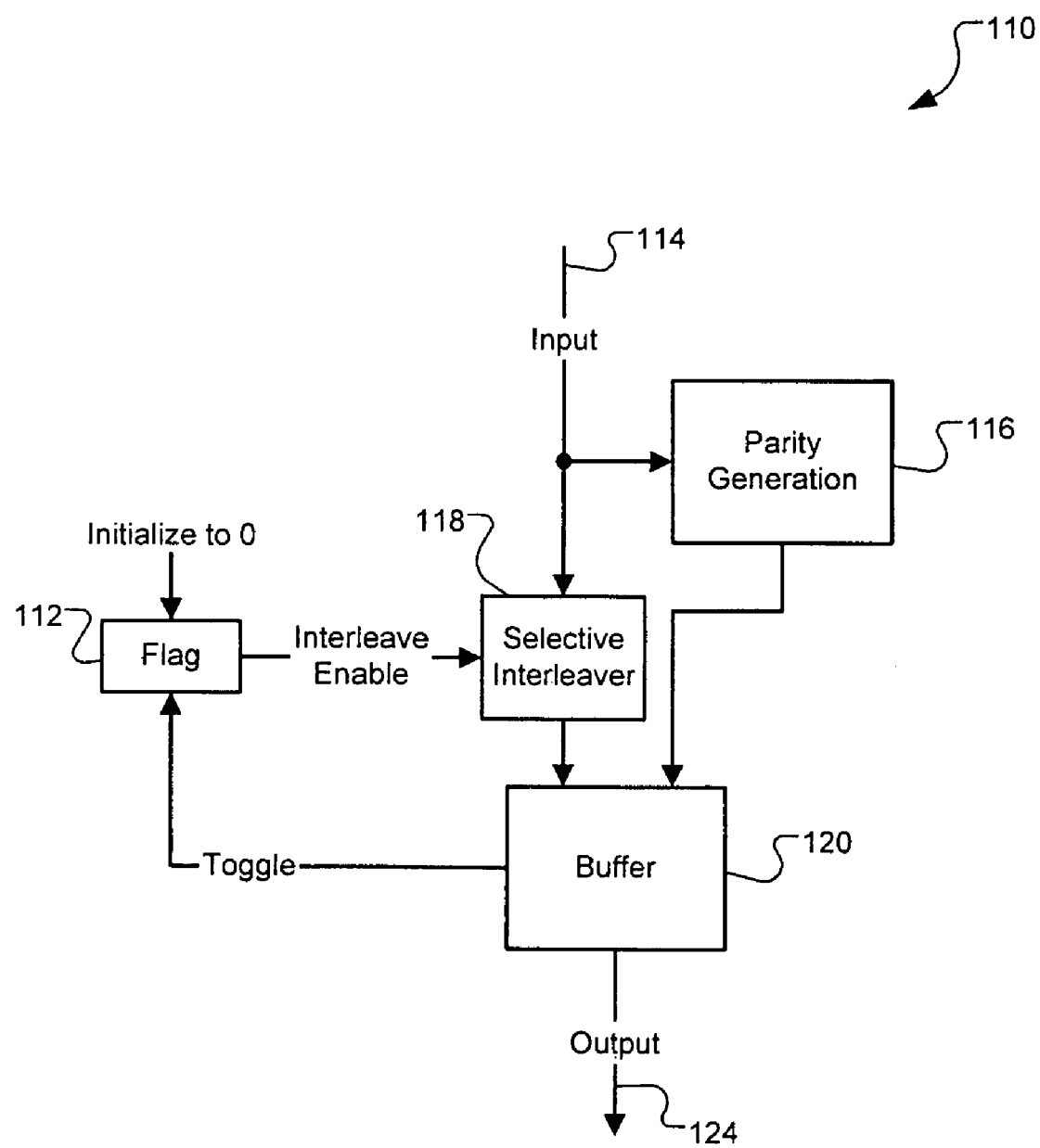
FIG. 6B is a more detailed functional block diagram of an exemplary implementation of a parity encoder according to the present invention.

Referring now to FIG. 6B, an exemplary implementation 110 of a universal parity encoder is presented. Upon starting, a flag module 112 is initialized to zero. N data bits are communicated from an input data stream 114 to a parity generation module 116, which generates P parity bits from the N data bits. For example, parity generation modules often generate one parity bit (P=1) by performing a logical XOR on the N input bits. The flag 112 determines whether a selective interleaver 118 will pass N data bits through unaltered or whether adjacent bits will be swapped (as described above, the first bit is swapped with the second, the third bit is swapped with the fourth, etc.). On the first pass, the flag 112 is zero, and the interleaver 118 will pass the N data bits through unaltered, which are then combined with the P parity bits in a buffer module 120. The buffer 120 also toggles the flag 112 so that the interleaver 118 will interleave the next block of N data bits. The buffer 120 then outputs the N+P bits 124. This process is repeated for each group of N data bits in the input data stream 114.

Figure 7A:
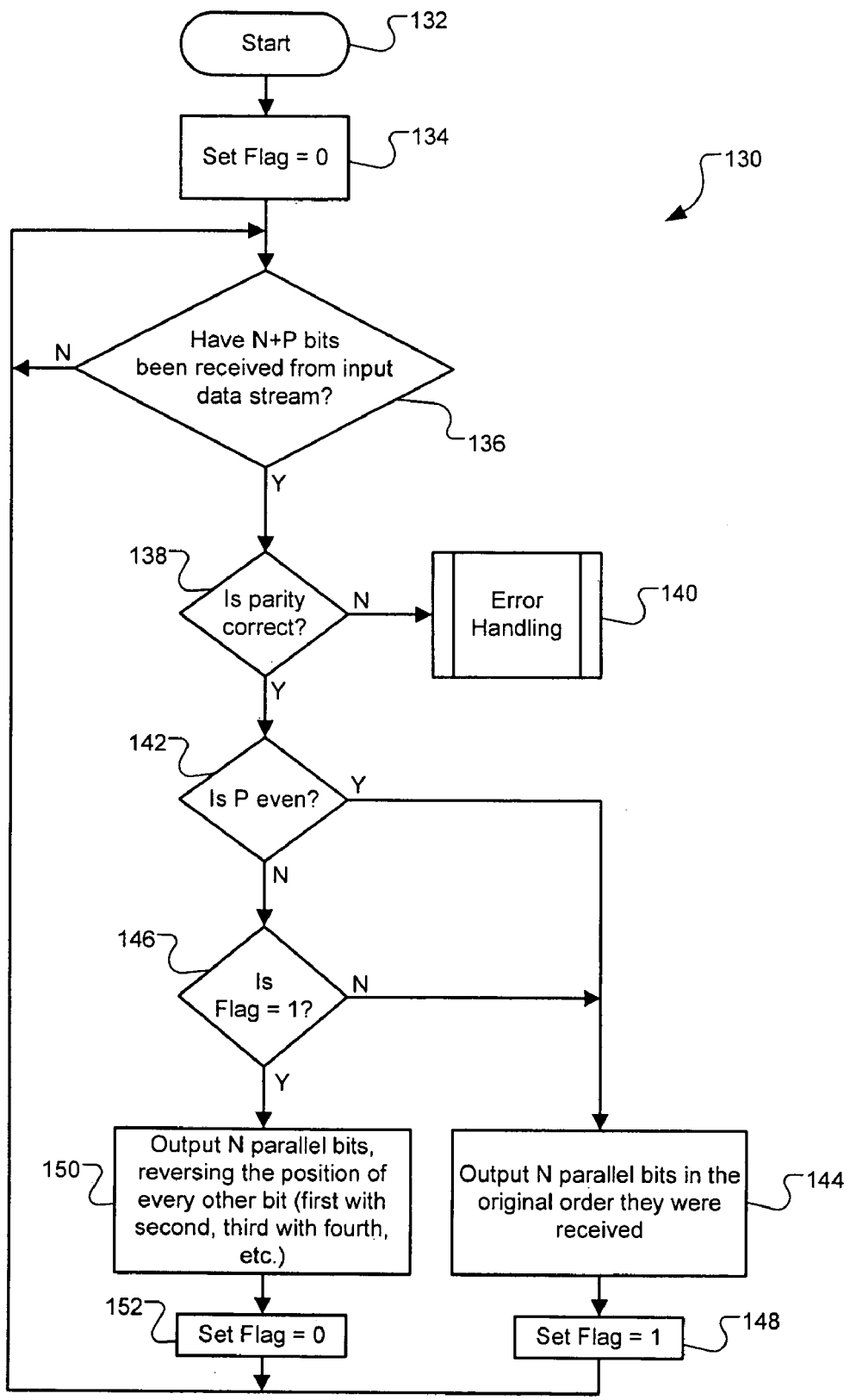
FIG. 7A is a flowchart illustrating steps performed by an exemplary parity decoder according to the present invention.

Referring now to FIG. 7A, a flowchart depicts the operation of an embodiment of a universal parity decoder 130 which will reverse the encoding. As with the encoder 80, upon starting in step 132, a flag is set to zero in step 134. The decoder then awaits the arrival of N+P input bits in step 136. A parity check in step 138 is performed, and if it fails, whatever error handling is specified will be performed in step 140. If the number of parity bits P is even in step 142, no rearrangement of the N data bits is ever necessary, and the N data bits will be output in the order they were received in step 144. If the number of parity bits P is odd in step 142, the value of the flag will be checked in step 146. On the first pass, the flag is zero in step 146, having been initialized in step 134, and the first block of N bits is output in the order they were received in step 144. The flag will then be set to one in step 148, causing the next block of N data bits to be rearranged in step 150. The bits are rearranged by swapping the first bit with the second, the third bit with the fourth, etc. After outputting the rearranged bits in step 150, the flag is re-set to zero in step 152. This process will repeat indefinitely, with each block of N data bits alternately rearranged in step 150 and unmodified in step 144 when output.

Figure 7B:
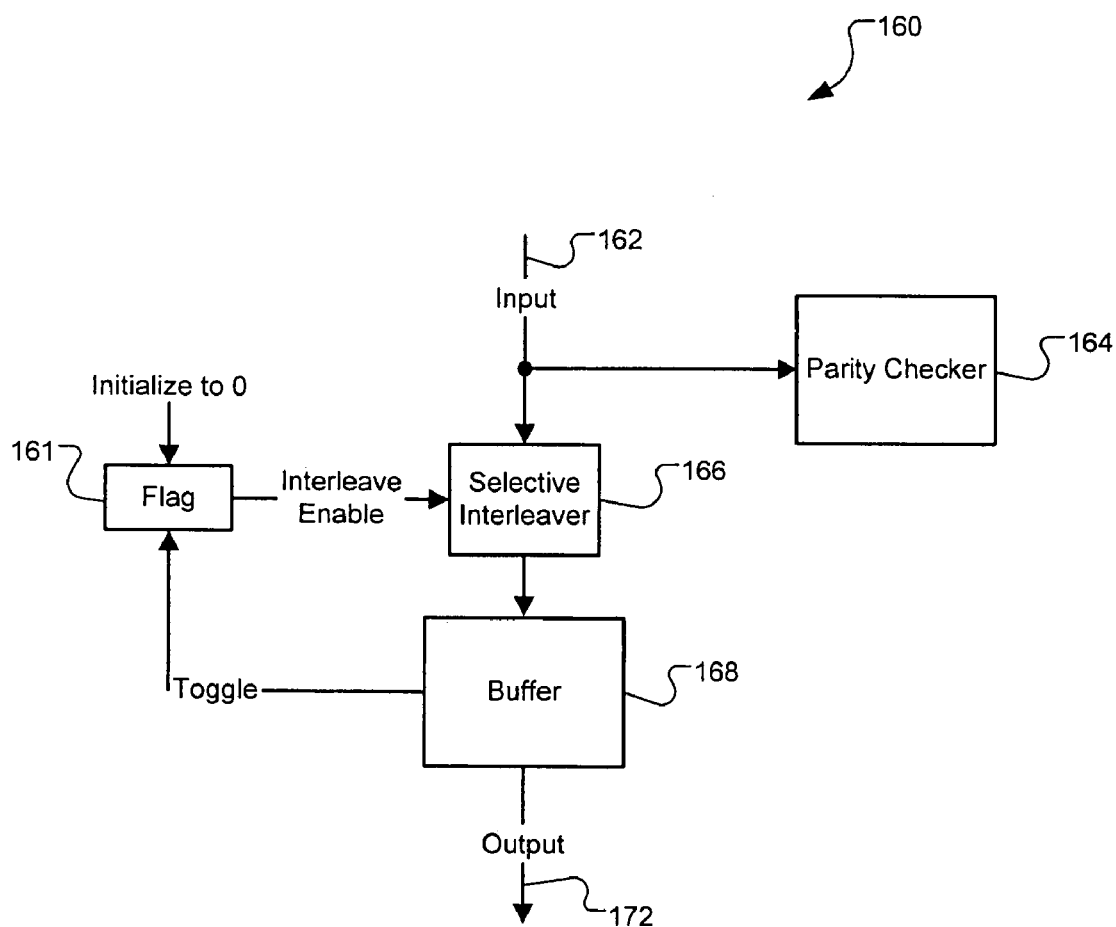
FIG. 7B is a more detailed functional block diagram of an exemplary implementation of a parity decoder according to the present invention.

Referring now to FIG. 7B, an exemplary implementation 160 of a universal parity decoder is presented. A flag module 161 is initialized to zero when the universal parity decoder 160 is first started. An input data stream 162 contains data blocks of N data bits each, and P bits of parity information associated with each data block. The N data bits and P parity bits are communicated to a parity checking module 164. The N data bits are also communicated to a selective interleaver module 166. The flag 161 determines whether the interleaver 166 will pass N bits through to a buffer module 168 unaltered or whether adjacent bits will be swapped (as above, the first bit is swapped with the second, the third bit is swapped with the fourth, etc.). On the first pass, the flag 161 is zero, and the interleaver 166 will pass the N data bits through unaltered. The buffer 168 also toggles the flag 161 so that the interleaver 166 will interleave the next block of N data bits. The buffer 168 then outputs N unencoded data bits 172. This process is repeated for each group of parity and data bits in the input data stream 162.

Figure 8:
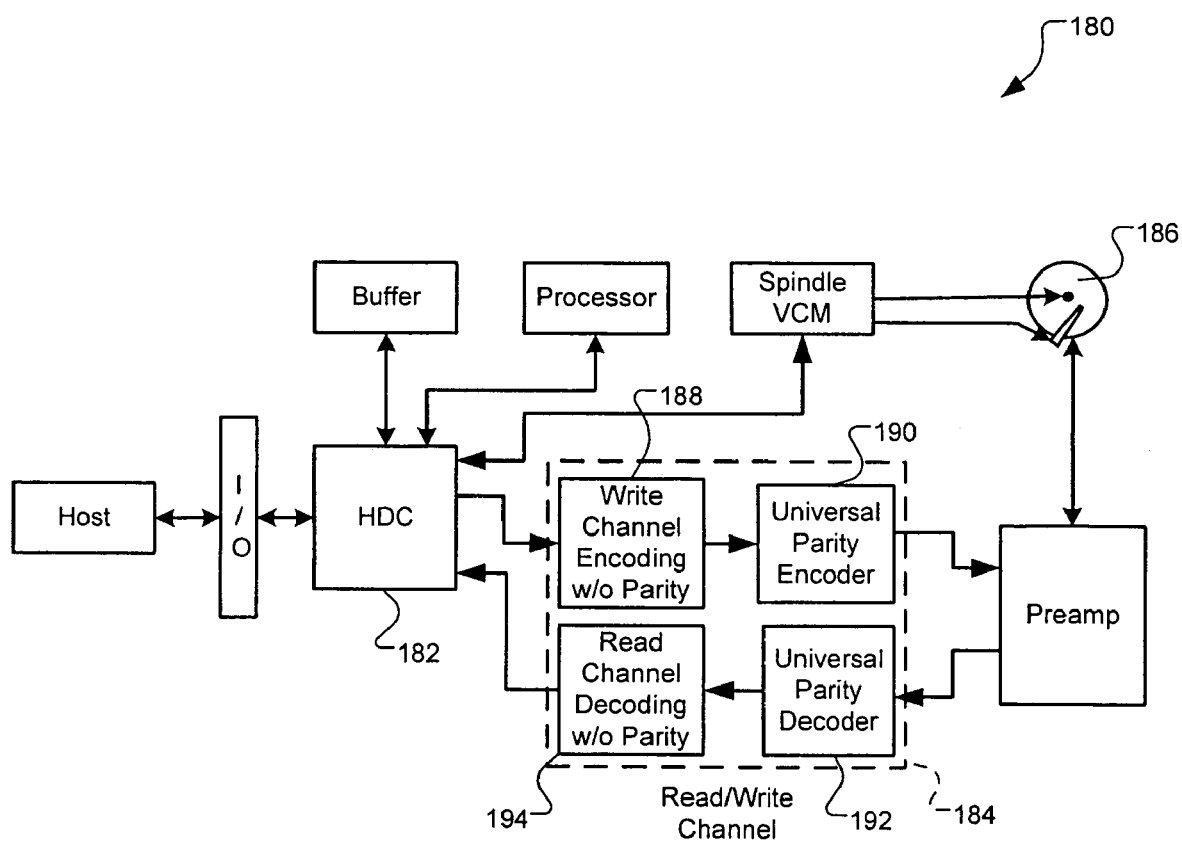
FIG. 8 is a functional block diagram illustrating an exemplary data storage device employing a universal parity encoder and decoder.

Now referring to FIG. 8, a hard disk drive 180 environment is presented in which a universal parity encoder and decoder may be used. A hard disk controller 182 communicates user data to a read/write channel 184 of the hard disk drive system 180. The read/write channel 184 encodes and decodes data to be written to and read from hard drive platters 186. The write channel encoding module 188 communicates data with a G/I constraint to a universal parity encoder 190, which encodes parity information with the data. A universal parity decoder 192 transmits data to a read channel decoding module 194, after removing parity information. The universal parity encoder 190 will not destroy the G/I constraints produced by the write channel encoding module 188. The resulting constraint will be (G+P)/(1+P/2) (rounding the I constraint up to the nearest whole number).

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims. These modifications include, but are not limited to, the substitution of any other additional bits for the parity bits described above, whether these bits serve an error checking and correcting ("ECC") purpose or not.

What is claimed is:

1. A data encoding system for a data stream, comprising:
    an interleaving module that receives the data stream as N bit data blocks and that reverses positions of at least two adjacent bits of selected ones of the N bit data blocks;
    a generating module that generates P error checking bits for each of the N bit data blocks, wherein P is greater than or equal to one; and
    an insertion module that receives the P error checking bits from the generating module, and that inserts the P error checking bits into the corresponding data block received from the interleaving module.

2. The data encoding system of claim 1 wherein the P error checking bits include parity information.

3. The data encoding system of claim 2 wherein P is equal to one.

4. The data encoding system of claim 1 wherein the interleaving module reverses bit positions within even data blocks or odd data blocks.

5. The data encoding system of claim 4 wherein the interleaving module swaps the bit positions within each pair of adjacent bits for said selected ones of the data blocks.

6. A communications system comprising the data encoding system of claim 1 and further comprising a run-length limited (RLL) encoder that generates the data stream.

7. A communications channel comprising the data encoding system of claim 1 and further comprising a data dependent scrambler (DDS) encoder that generates the data stream.

8. The data encoding system of claim 1 wherein said N bits are reversed based on number identification of a data block in said N bit data blocks.

9. The data encoding system of claim 1 wherein bits of the N bit data blocks are reversed based on generation of an even or odd number of said P error checking bits.

10. A data encoding system for a data stream, comprising:
   an interleaving module that receives the data stream as N bit data blocks and that reverses positions of at least two bits of selected ones of the N-bit data blocks;
   a generating module that generates P error checking bits for each of the N bit data blocks, wherein P is greater than or equal to one; and
   an insertion module that receives the P error checking bits from the generating module, and that inserts the P error checking bits into the corresponding data block received from the interleaving module;
   wherein the data stream has a G/I constraint and wherein the data encoding system produces an output data stream having an output G constraint equal to (G+P) and an output I constraint equal to a rounded up integer of (I+P/2).

11. A read/write channel comprising a data encoding system for a data stream, comprising:
   an interleaving module that receives the data stream as N bit data blocks and that reverses positions of at least two bits of selected ones of the N bit data blocks;
   a generating module that generates P error checking bits for each of the N bit data blocks, wherein P is greater than or equal to one;
   an insertion module that receives the P error checking bits from the generating module, and that inserts the P error checking bits into the corresponding data block received from the interleaving module; and
   a run-length limited (RLL) encoder that generates the data stream, wherein the data stream has a G/I constraint and wherein the data encoding system produces an output data stream having an output G constraint equal to (G+P) and an output I constraint equal to a rounded up integer of (I+P/2).

12. A data encoding system for a data stream, comprising:
   interleaving means for receiving the data stream as N bit data blocks and for reversing positions of at least two adjacent bits of selected ones of the N bit data blocks;
   generating means for generating P error checking bits for each of the N bit data blocks, wherein P is greater than or equal to one; and
   insertion means for receiving the P error checking bits from the generating means and for inserting the P error checking bits into the corresponding data block received from the interleaving means.

13. The data encoding system of claim 12 wherein the P error checking bits include parity information.

14. The data encoding system of claim 13 wherein P is equal to one.

15. The data encoding system of claim 12 wherein the interleaving means swaps the bit positions within each pair of adjacent bits for said selected ones of the data blocks.

16. A communications system comprising the data encoding system of claim 12 and further comprising run-length limited (RLL) means for generating the data stream.

17. A communications channel comprising the data encoding system of claim 12 and further comprising data dependent scrambling (DDS) means for generating the data stream.

18. A data encoding system for a data stream, comprising:
   interleaving means for receiving the data stream as N bit data blocks and for reversing positions of at least two bits of selected ones of the N bit data blocks;
   generating means for generating P error checking bits for each of the N bit data blocks, wherein P is greater than or equal to one; and
   insertion means for receiving the P error checking bits from the generating means and for inserting the P error checking bits into the corresponding data block received from the interleaving means;
   wherein the data stream has a G/I constraint and wherein the data encoding system produces an output data stream having an output G constraint equal to (G+P) and an output I constraint equal to a rounded up integer of (I+P/2).

19. A read/write channel comprising a data encoding system for a data stream, comprising:
   interleaving means for receiving the data stream as N bit data blocks and for reversing positions of at least two bits of selected ones of the N bit data blocks;
   generating means for generating P error checking bits for each of the N bit data blocks, wherein P is greater than or equal to one;
   insertion means for receiving the P error checking bits from the generating means and for inserting the P error checking bits into the corresponding data block received from the interleaving means; and
   run-length limited (RLL) means for generating the data stream, wherein the data stream has a G/I constraint and wherein the data encoding system produces an output data stream having an output G constraint equal to (G+P) and an output I constraint equal to a rounded up integer of (I+P/2).

20. A read/write channel comprising a data encoding system for a data stream, comprising:
   interleaving means for receiving the data stream as N bit data blocks and for reversing positions of at least two bits of selected ones of the N bit data blocks;
   generating means for generating P error checking bits for each of the N bit data blocks, wherein P is greater than or equal to one;
   insertion means for receiving the P error checking bits from the generating means and for inserting the P error checking bits into the corresponding data block received from the interleaving means; and
   data dependent scrambling (DDS) means for generating the data stream, wherein the data stream has a G/I constraint and wherein the data encoding system produces an output data stream having an output G constraint equal to (G+P) and an output I constraint equal to a rounded up integer of (I+P/2).

21. A method for operating a data encoding system for a data stream, comprising:
   receiving the data stream as N bit data blocks;
   reversing positions of at least two adjacent bits of selected ones of the N bit data blocks;

generating P error checking bits for each of the N bit data blocks, wherein P is greater than or equal to one; and inserting the P error checking bits into the corresponding data block.

22. The method of claim 21 wherein the P error checking bits include parity information.

23. The method of claim 22 wherein P is equal to one.

24. The method of claim 21 further comprising reversing bit positions within even data blocks or odd data blocks.

25. The method of claim 24 further comprising swapping the bit positions within each pair of adjacent bits for said selected ones of the data blocks.

26. A method for operating a data encoding system for a data stream, comprising:

receiving the data stream as N bit data blocks;

reversing positions of at least two bits of selected ones of the N bit data blocks;

generating P error checking bits for each of the N bit data blocks, wherein P is greater than or equal to one; and inserting the P error checking bits into the corresponding data block, wherein the data stream has a G/I constraint and further comprising producing an output data stream having an output G constraint equal to (G+P) and an output I constraint equal to a rounded up integer of (I+P/2).

27. A software method for operating a data encoding system for a data stream, comprising:

receiving the data stream as N bit data blocks;

reversing positions of at least two adjacent bits of selected ones of the N bit data blocks;

generating P error checking bits for each of the N bit data blocks, wherein P is greater than or equal to one; and inserting the P error checking bits into the corresponding data block.

28. The software method of claim 27 wherein the P error checking bits include parity information.

29. The software method of claim 28 wherein P is equal to one.

30. The software method of claim 27 further comprising reversing bit positions within even data blocks or odd data blocks.

31. The software method of claim 30 further comprising swapping the bit positions within each pair of adjacent bits for said selected ones of the data blocks.

32. A software method for operating a data encoding system for a data stream, comprising:

receiving the data stream as N bit data blocks;

reversing positions of at least two N bits of selected ones of the N bit data blocks;

generating P error checking bits for each of the N bit data blocks, wherein P is greater than or equal to one; and inserting the P error checking bits into the corresponding data block, wherein the data stream has a G/I constraint and further comprising producing an output data stream having an output G constraint equal to (G+P) and an output I constraint equal to a rounded up integer of (I+P/2).

\* \* \* \* \*

UNITED STATES PATENT AND TRADEMARK OFFICE
CERTIFICATE OF CORRECTION

PATENT NO. : 7,392,464 B1 Page 1 of 1
APPLICATION NO. : 10/896726
DATED : June 24, 2008
INVENTOR(S) : Weishi Feng et al.

It is certified that error appears in the above-identified patent and that said Letters Patent is hereby corrected as shown below:

| | |
|---|---|
| Column 2, Line 5 | Delete "," after "interleaving" |
| Column 3, Line 62 | Delete "(1+P/2)" and insert -- (I + P/2) -- |
| Column 4, Line 30 | Delete "bgb$_{11}$" and insert -- b$_9$b$_{11}$ -- |
| Column 5, Line 61 | Delete "(1+P/2)" and insert -- (I + P/2) -- |
| Column 5, Line 66 | Delete "RLL-ehcoded" and insert -- RLL-encoded -- |
| Column 6, Line 13 | Delete "." after "Dependent" |
| Column 6, Line 53 | Delete "(1+P/2)" and insert -- (I + P/2) -- |
| Column 8, Line 37 | Delete "(1+P/2)" and insert -- (I + P/2) -- |

Signed and Sealed this

Twenty-sixth Day of August, 2008

JON W. DUDAS
*Director of the United States Patent and Trademark Office*